United States Patent
Taniguchi

(10) Patent No.: US 9,083,304 B2
(45) Date of Patent: Jul. 14, 2015

(54) LAMINATED BALANCED FILTER

(71) Applicant: Murata Manufacturing Co., Ltd., Nagaokakyo-shi, Kyoto-fu (JP)

(72) Inventor: Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 186 days.

(21) Appl. No.: 13/688,537

(22) Filed: Nov. 29, 2012

(65) Prior Publication Data
US 2013/0154768 A1    Jun. 20, 2013

(30) Foreign Application Priority Data

Nov. 30, 2011   (JP) ................................ 2011-261592
Oct. 18, 2012   (JP) ................................ 2012-230515

(51) Int. Cl.
*H03H 7/09*   (2006.01)
*H03H 7/12*   (2006.01)
*H03H 7/42*   (2006.01)
(Continued)

(52) U.S. Cl.
CPC . *H03H 7/09* (2013.01); *H03H 7/12* (2013.01); *H03H 7/42* (2013.01); *H03H 7/1708* (2013.01); *H03H 7/1775* (2013.01); *H03H 2001/0085* (2013.01)

(58) Field of Classification Search
CPC ... H03H 2001/0085; H03H 7/09; H03H 7/12; H03H 7/1708; H03H 7/1775; H03H 7/42
USPC ............................................ 333/25, 185, 177
See application file for complete search history.

(56) References Cited

U.S. PATENT DOCUMENTS

2004/0164817 A1   8/2004   Nosaka
2007/0236306 A1   10/2007  Kearns et al.
(Continued)

FOREIGN PATENT DOCUMENTS

JP   10-209816 A    8/1998
JP   2004-274715 A  9/2004
(Continued)

OTHER PUBLICATIONS

Official Communication issued in corresponding Japanese Patent Application No. 2012-230515, mailed on Mar. 10, 2015.

*Primary Examiner* — Benny Lee
*Assistant Examiner* — Jorge Salazar, Jr.
(74) *Attorney, Agent, or Firm* — Keating & Bennett, LLP

(57) ABSTRACT

A laminated balanced filter includes one unbalanced terminal, two balanced terminals, a ground terminal, an unbalanced-side LC parallel resonator, an intermediate LC parallel resonator, and a balanced-side inductor. The inductor electrode pattern of the balanced-side inductor includes a first portion extending from one end portion to a connection portion and a second portion extending from the other end portion to the connection portion. A direction of a current flowing through the first portion is opposite to a direction of a current flowing through the inductor electrode pattern of the intermediate LC parallel resonator. A direction of a current flowing through the second portion of the balanced-side inductor is the same as a direction of a current flowing through the inductor electrode pattern of the intermediate LC parallel resonator. The laminated balanced filter further includes a coupling capacitor connected between a balanced terminal connected to the first portion and an unbalanced terminal.

17 Claims, 9 Drawing Sheets

(51) Int. Cl.
*H03H 1/00* (2006.01)
*H03H 7/01* (2006.01)

(56) References Cited

U.S. PATENT DOCUMENTS

| | | |
|---|---|---|
| 2010/0283557 A1 | 11/2010 | Taniguchi |
| 2011/0140806 A1 | 6/2011 | Taniguchi |
| 2011/0169586 A1 | 7/2011 | Taniguchi |
| 2012/0032758 A1 | 2/2012 | Mori et al. |

FOREIGN PATENT DOCUMENTS

| | | |
|---|---|---|
| JP | 2007-282231 A | 10/2007 |
| JP | 2007-305861 A | 11/2007 |
| JP | 2011-124880 A | 6/2011 |
| WO | 2009/142113 A1 | 11/2009 |
| WO | 2010/055725 A1 | 5/2010 |
| WO | 2010/122930 A1 | 10/2010 |

LAMINATED BALANCED FILTER

BACKGROUND OF THE INVENTION

1. Field of the Invention

The present invention relates to a laminated balanced filter including a laminated body including a plurality of dielectric layers and a plurality of electrode patterns located on the dielectric layers and having a balanced-unbalanced transforming function.

2. Description of the Related Art

A known laminated balanced filter including a laminated body including a plurality of dielectric layers and a plurality of electrode patterns located on the dielectric layers and having a balanced-unbalanced transforming function is described in Japanese Unexamined Patent Application Publication No. 2011-124880. FIG. 8 is the exploded perspective view of the laminated balanced filter described in Japanese Unexamined Patent Application Publication No. 2011-124880, and FIG. 9 is the equivalent circuit diagram of this laminated balanced filter.

As illustrated in FIG. 8, this laminated balanced filter is configured using a laminated body where dielectric layers 251, 242, 241, 271, 211, 201, and 221 and electrode patterns 143, 142, 141, 131, 121, 120, 123, and 122 are laminated, the electrode patterns being formed on the dielectric layers. In addition, as illustrated in FIG. 9, this laminated balanced filter includes an unbalanced terminal T1 and balanced terminals T2 and T3. In addition, an LC parallel resonator is configured using an inductor L1 and a capacitor C1, configured by the electrode pattern 131, and one end portion of the corresponding LC parallel resonator is connected to the unbalanced terminal T1. Both end portions of an inductor L4 are individually connected to the balanced terminals T2 and T3.

In this circuit, the inductor L1 and the inductor L4 are coupled to each other, and accordingly, the corresponding laminated balanced filter turns out to have a balanced-unbalanced transforming function. In addition, inductors L2 and L3 and capacitors C2 and C3 function as a circuit for impedance matching and impedance conversion.

SUMMARY OF THE INVENTION

In the laminated balanced filter described in Japanese Unexamined Patent Application Publication No. 2011-124880, since it is difficult to adjust the position of an attenuation pole formed on a frequency side higher than a pass band, there has been a problem that it has been difficult to freely design a characteristic of a region of a frequency higher than the pass band. Therefore, in order to make it possible to adjust the position of an attenuation pole formed on a frequency side higher than a pass band, the present inventor designed a laminated balanced filter including two LC parallel resonators and an inductor. In addition, in order to cause an attenuation pole to occur in a desired frequency band, the present inventor performed design to connect a coupling capacitor between an input terminal and output terminal. In addition, during the designing, the inventor discovered that it was possible to obtain a laminated balanced filter whose phase characteristic is good.

Based on these discoveries, preferred embodiments of the present invention were developed to provide a laminated balanced filter that makes it possible to freely design an attenuation pole in a region whose frequency is higher than a pass band and to achieve a phase characteristic that is good.

According to a preferred embodiment of the present invention, a laminated balanced filter includes a laminated body including a plurality of dielectric layers and a plurality of electrode patterns located on the dielectric layers, the laminated balanced filter including one unbalanced terminal, two balanced terminals, a ground terminal, an unbalanced-side LC parallel resonator including one end portion connected to the ground terminal and the other end portion connected to the unbalanced terminal, a balanced-side inductor including two end portions individually connected to the balanced terminals, and at least one intermediate LC parallel resonator including one end portion connected to the ground terminal and disposed between the unbalanced-side LC parallel resonator and the balanced-side inductor on an equivalent circuit, wherein the unbalanced-side LC parallel resonator and an intermediate LC parallel resonator disposed nearest to the unbalanced-side LC parallel resonator among the intermediate LC parallel resonators on an equivalent circuit are electromagnetic-field-coupled to each other, the balanced-side inductor and an intermediate LC parallel resonator disposed nearest to the balanced-side inductor among the intermediate LC parallel resonators on an equivalent circuit are electromagnetic-field-coupled to each other, the unbalanced terminal, the balanced terminal, and the ground terminal are located on the surface of the laminated body, the balanced-side inductor includes a substantially helical-shaped inductor electrode pattern in a predetermined dielectric layer of the laminated body, a connection portion in a central or approximately central portion of the inductor electrode pattern is connected to the ground terminal, and includes a first portion leading from one end portion thereof to the connection portion and a second portion leading from the other end portion thereof to the connection portion, the intermediate LC parallel resonator includes a substantially helical-shaped inductor electrode pattern located in a layer in the laminated body, the layer being different from the inductor electrode pattern of the balanced-side inductor, a direction of a current flowing through the first portion of the inductor electrode pattern of the balanced-side inductor is opposite to a direction of a current flowing through the inductor electrode pattern of the intermediate LC parallel resonator, a direction of a current flowing through the second portion of the inductor electrode pattern of the balanced-side inductor is the same as a direction of the current flowing through the inductor electrode pattern of the intermediate LC parallel resonator, and the laminated balanced filter further includes a coupling capacitor connected between the balanced terminal connected to the first portion side and the unbalanced terminal.

In addition, in the laminated balanced filter according to a preferred embodiment of the present invention, it is desirable that at least portions of an aperture of the inductor electrode pattern of the intermediate LC parallel resonator and an aperture of the inductor electrode pattern of the balanced-side inductor overlap with each other when being viewed from a lamination direction.

In addition, in the laminated balanced filter according to a preferred embodiment of the present invention, it is desirable that positions of central axes of the aperture of the inductor electrode pattern of the intermediate LC parallel resonator and the aperture of the inductor electrode pattern of the balanced-side inductor coincide with each other when being viewed from the lamination direction.

In addition, in the laminated balanced filter according to a preferred embodiment of the present invention, it is desirable that the unbalanced-side LC parallel resonator includes a substantially helical-shaped inductor electrode pattern, wherein the circling direction of the inductor electrode pattern of the unbalanced-side LC parallel resonator and the circling direction of the inductor electrode pattern of the intermediate LC parallel resonator are opposite to each other when being viewed from the lamination direction.

In addition, in the laminated balanced filter according to a preferred embodiment of the present invention, it is desirable that each inductor electrode pattern and a capacitor electrode pattern of the laminated balanced filter are separately disposed on one main surface side and the other main surface side in the lamination direction of the laminated body.

In addition, in the laminated balanced filter according to a preferred embodiment of the present invention, it is desirable that the inductor electrode pattern and the capacitor electrode pattern of the unbalanced-side LC parallel resonator are separately disposed on one main surface side and the other main surface side in the lamination direction of the laminated body and the inductor electrode pattern of the intermediate LC parallel resonator and the inductor electrode pattern of the balanced-side inductor are disposed therebetween.

Since, in the laminated balanced filter according to a preferred embodiment of the present invention, the coupling capacitor is connected between the balanced terminal connected to the first portion side and the unbalanced terminal, such that it is possible to provide the laminated balanced filter in which it is possible to freely design an attenuation pole in a region whose frequency is higher than a pass band and the phase characteristic thereof is good.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described.

Figure 1:
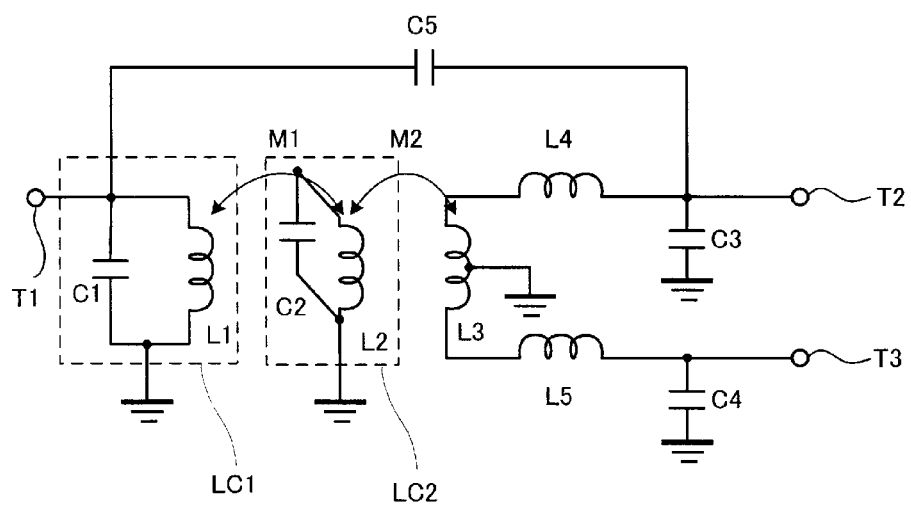
FIG. 1 is an equivalent circuit diagram of a laminated balanced filter according to a preferred embodiment of the present invention.

FIG. 1 is the equivalent circuit diagram of a laminated balanced filter according to a preferred embodiment of the present invention. A terminal T1 is an unbalanced terminal to which an unbalanced signal is input. In addition, terminals T2 and T3 are balanced terminals from which a balanced signal is output. Between the terminal T1 and the terminals T2 and T3, an unbalanced-side LC parallel resonator LC1, an intermediate LC parallel resonator LC2, a balanced-side inductor L3, inductors L4 and L5, capacitors C3 and C4, and a coupling capacitor C5 are disposed.

A capacitor C1 and an inductor L1 are connected in parallel to each other, and hence, the unbalanced-side LC parallel resonator LC1 is configured. In addition, a capacitor C2 and an inductor L2 are connected in parallel to each other, and hence, the intermediate LC parallel resonator LC2 is configured. Owing to the resonant circuit of the unbalanced-side LC parallel resonator LC1 and the resonant circuit of the intermediate LC parallel resonator LC2, the pass band width and the center frequency of the filter are designed.

One end portion of the unbalanced-side LC parallel resonator LC1 is connected to a ground, and the other end portion thereof is connected to the unbalanced terminal T1. In addition, the other end portion of the intermediate LC parallel resonator LC2 is connected to the ground. The unbalanced-side LC parallel resonator LC1 and the intermediate LC parallel resonator LC2 are electromagnetic-field-coupled to each other through the inductor L1 and the inductor L2. In other words, the inductor L1 and the inductor L2 are magnetic-field-coupled to each other, and hence, the unbalanced-side LC parallel resonator LC1 and the intermediate LC parallel resonator LC2 are coupled to each other. At this time, between the inductor L1 and the inductor L2, mutual inductance M1 occurs.

In the intermediate LC parallel resonator LC2 and the balanced-side inductor L3, the inductor L2 and the balanced-side inductor L3 are electromagnetic-field-coupled to each other. Between the inductor L2 and the balanced-side inductor L3, mutual inductance M2 occurs.

A connection portion in the middle of the balanced-side inductor L3 is connected to the ground. In addition, between one end portion of the balanced-side inductor L3 and the terminal T2, the inductor L4 is connected. In the same way, between the other end portion of the balanced-side inductor L3 and the terminal T3, the inductor L5 is connected. One end portion of the capacitor C3 is connected to a connection point between the terminal T2 and the inductor L4, and the other end portion thereof is connected to the ground. In the same way, one end portion of the capacitor C4 is connected to a connection point between the terminal T3 and the inductor L5, and the other end portion thereof is connected to the ground. By setting the inductors L4 and L5 and the capacitors C3 and C4 to predetermined values, it is possible to set, to a desired value, impedance between the terminals T2 and T3 from which the balanced signal is output.

Furthermore, between the terminal T1 and the terminal T2, the coupling capacitor C5 is connected. The coupling capacitor C5 is arranged so as to shift an attenuation pole to a desired frequency on a frequency side higher than a pass band.

In the laminated balanced filter having such a configuration, for example, when an unbalanced signal is input from the terminal T1, the unbalanced signal is subjected to balanced-unbalanced transformation, and a balanced signal having a predetermined phase difference is output from the terminals T2 and T3.

Figure 2:
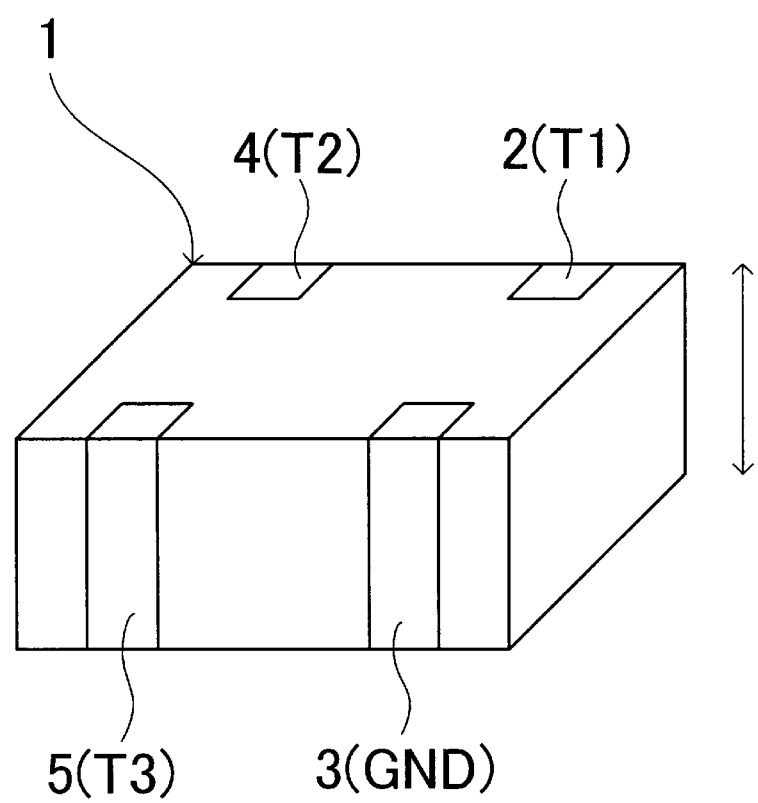
FIG. 2 is a perspective view illustrating a laminated balanced filter according to a preferred embodiment of the present invention.

FIG. 2 is a perspective view illustrating a laminated balanced filter according to a preferred embodiment of the present invention. The laminated balanced filter includes a laminated body 1 including a plurality of dielectric layers and electrode patterns laminated on each other. This laminated body 1 preferably has a substantially rectangular parallelepiped shape, and includes two main surfaces perpendicular or substantially perpendicular to a lamination direction (refer to an arrow in FIG. 2) and four side surfaces connecting the two main surfaces. An unbalanced terminal 2, a ground terminal 3, and balanced terminals 4 and 5 are external terminals, and located on the surfaces of the laminated body 1. In more detail, the unbalanced terminal 2, the ground terminal 3, and the balanced terminals 4 and 5 are arranged on the two main surfaces and in side surfaces so as to connect portions located on the two main surfaces. The unbalanced terminal 2, the ground terminal 3, the balanced terminal 4, and the balanced terminal 5 correspond to the terminal T1 in FIG. 1, the ground in FIG. 1, the terminal T2 in FIG. 1, and the terminal T3 in FIG. 1, respectively.

Figure 3:
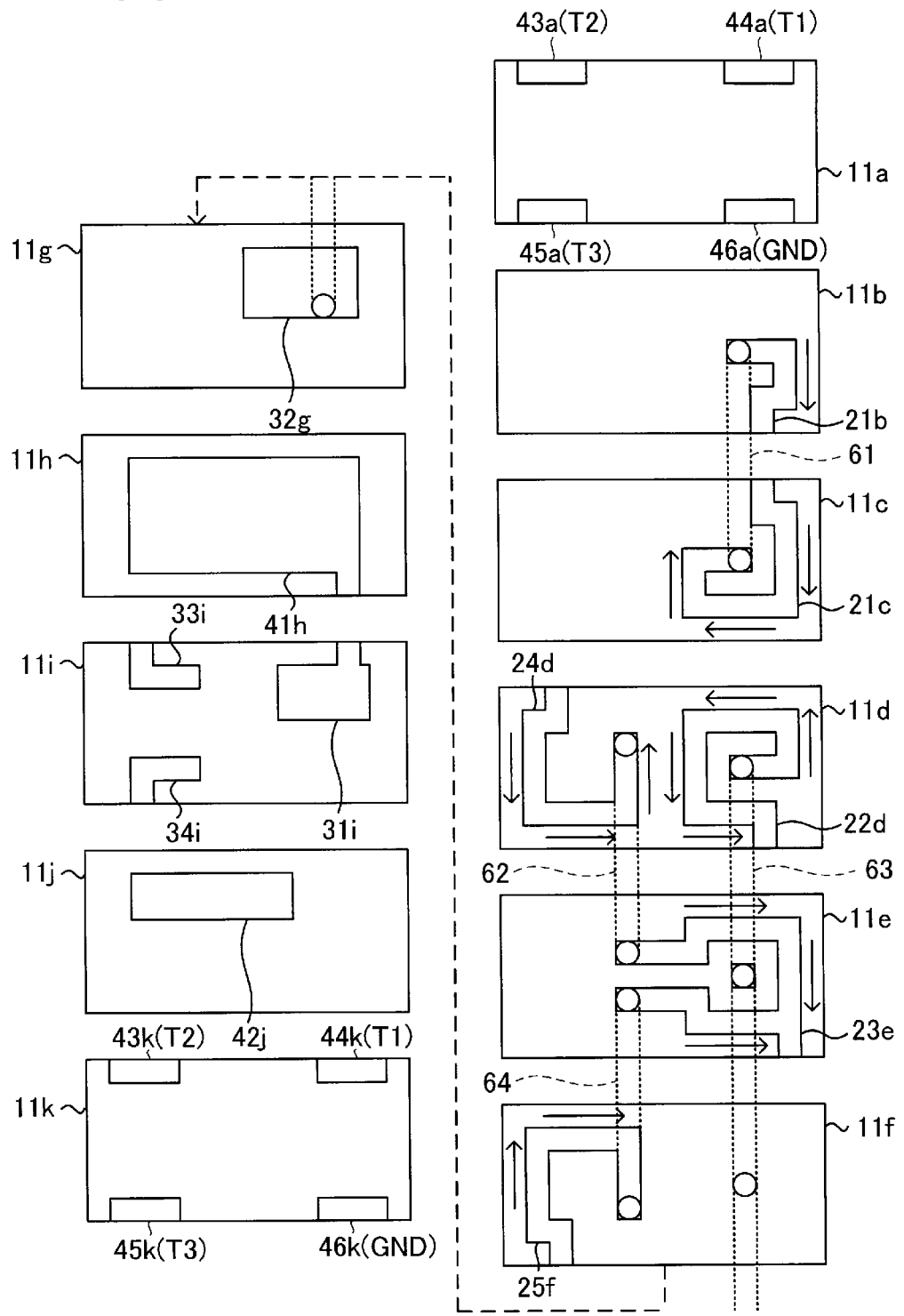
FIG. 3 is a plan view illustrating dielectric layers configuring a laminated balanced filter according to a preferred embodiment of the present invention.

FIG. 3 is a plan view illustrating dielectric layers and electrode patterns, which configure a laminated balanced filter according to a preferred embodiment of the present invention. The laminated balanced filter includes a laminated body including a plurality of dielectric layers 11a to 11k and a plurality of electrode patterns located on the dielectric layers 11a to 11k.

A terminal electrode 43a configuring a portion of the balanced terminal 4, a terminal electrode 44a configuring a portion of the unbalanced terminal 2, a terminal electrode 45a configuring a portion of the balanced terminal 5, and a terminal electrode 46a configuring a portion of the ground terminal 3 are individually provided on the dielectric layer 11a. An inductor electrode pattern 21b is located on the dielectric layer 11b. An inductor electrode pattern 21c is located on the dielectric layer 11c. Inductor electrode patterns 22d and 24d are located on the dielectric layer 11d. An inductor electrode pattern 23e is located on the dielectric layer 11e. An inductor electrode pattern 25f is located on the dielectric layer 11f. A capacitor electrode pattern 32g is located on the dielectric layer 11g. A ground electrode pattern 41h is located on the dielectric layer 11h. Capacitor electrode patterns 31i, 33i, and 34i are located on the dielectric layer 11i. A coupling electrode pattern 42j is located on the dielectric layer 11j. Terminal electrodes 43k, 44k, 45k, and 46k are located on the dielectric layer 11k.

Each of the inductor electrode patterns 21b, 22d, 23e, 24d, and 25f preferably has a substantially helical shape, for example. The term "helical shape" substantially means a shape continuously arranged so that an electrode pattern circles around a predetermined central axis. In addition, a portion surrounded by an inductor electrode pattern when being viewed from a lamination direction is referred to as an aperture.

In addition, while not illustrated, in the side surfaces of the dielectric layer, electrode patterns are preferably formed after lamination so as to connect the terminal electrode patterns 43a, 44a, 45a, and 46a to the terminal electrode patterns 43k, 44k, 45k, and 46k, respectively.

After being laminated in the order of "a" to "k" and fixed by applying pressure, for example, the dielectric layers 11a to 11k are fired to define a laminated body. The dielectric layer 11k is laminated with respect to the other dielectric layers 11a to 11j so that the terminal electrodes 43k, 44k, 45k, and 46k are located in the surface of the laminated body after lamination.

Via electrodes 61, 62, 63, and 64 are arranged in the lamination direction of the laminated body so as to individually penetrate the dielectric layers 11b, 11d, 11d to 11f, and 11e.

A correspondence relationship between FIG. 1 to FIG. 3 will be described. The inductor electrode patterns 21b and 21c are connected to each other through the via electrode 61. One end portion of the inductor electrode pattern 21c is connected to the unbalanced terminal 2 in FIG. 2 (T1 in FIG. 1). In addition, one end portion of the inductor electrode pattern 21b is connected to the ground terminal 3 in FIG. 2 (the ground in FIG. 1). The inductor L1 is configured by the inductor electrode patterns 21b and 21c and the via electrode 61.

The capacitor electrode pattern 31i is extracted to a side surface on one long-side side of the laminated body 1, and connected to the unbalanced terminal 2 in FIG. 2 (T1 in FIG. 1) and the inductor electrode pattern 21c. The capacitor electrode pattern 31i and the ground electrode pattern 41h face each other through the dielectric layer 11h, and configure the capacitor C1. In addition, the ground electrode 41h is extracted to a side surface on the other long-side side of the laminated body 1, and connected to the ground terminal 3 in FIG. 2 (the ground in FIG. 1). In this way, the inductor L1 and the capacitor C1 are connected in parallel to each other through the unbalanced terminal 2 and the ground terminal 3, and configure the unbalanced-side LC parallel resonator LC1.

One end portion of the inductor electrode pattern 22d is connected to the ground terminal 3 in FIG. 2 (the ground in FIG. 1). In addition, the other end portion of the inductor electrode pattern 22d is connected to the capacitor electrode pattern 32g through the via electrode 63. The capacitor electrode pattern 32g and the ground electrode pattern 41h face each other through the dielectric layer 11g, and configure the capacitor C2. In this way, the inductor L2 and the capacitor C2 are connected in parallel to each other through the via electrode 63 and the ground terminal 3, and configure the intermediate LC parallel resonator LC2.

The inductor L1 and the inductor L2 are disposed with being adjacent to each other in the lamination direction so as to be electromagnetic-field-coupled to each other. In addition, between the inductor electrode pattern 21c and the inductor electrode pattern 22d, no electrode pattern exists.

The aperture of the inductor L1 and the aperture of the inductor L2 are arranged so that at least portions thereof overlap with each other when being viewed from the lamination direction. Accordingly, between the inductor L1 and the inductor L2, capacitive coupling mainly occurs. In addition, owing to the intensity of the electromagnetic field coupling between the inductor L1 and the inductor L2, it is possible to design the pass band width of a filter.

In addition, when being viewed from the lamination direction, the positions of the central axes of the inductor L1 and the inductor L2 coincide with each other. In addition, when being viewed from the lamination direction, portions of the electrode patterns of the inductor L1 and the inductor L2 overlap with each other.

The inductor electrode pattern 23e configures the balanced-side inductor L3. The middle of the inductor electrode pattern 23e is connected to the ground terminal 3 in FIG. 2 (the ground in FIG. 1).

One end portion of the inductor electrode pattern 23e is connected to the inductor electrode pattern 24d through the via electrode 62, and the other end portion thereof is connected to the inductor electrode pattern 25f through the via electrode 64. The inductor electrode pattern 24d configures the inductor L4, and one end portion thereof is extracted to a side surface on one long-side side of the laminated body 1, and connected to the balanced terminal 4 in FIG. 2 (T2 in FIG. 1). In addition, the inductor electrode pattern 25f configures the inductor L5, and one end portion thereof is extracted to a side surface on the other long-side side of the laminated body 1, and connected to the balanced terminal 5 in FIG. 2 (T3 in FIG. 1).

The capacitor electrode pattern 33i is extracted to a side surface on one long-side side of the laminated body 1, and connected to the unbalanced terminal 4 in FIG. 2 (T2 in FIG.

1). The capacitor electrode pattern 33i and the ground electrode pattern 41h face each other through the dielectric layer 11h, and configure the capacitor C3.

The capacitor electrode pattern 34i is extracted to a side surface on the other long-side side of the laminated body 1, and connected to the unbalanced terminal 5 in FIG. 2 (T3 in FIG. 1). The capacitor electrode pattern 34i and the ground electrode pattern 41h face each other through the dielectric layer 11h, and configure the capacitor C4.

The coupling electrode pattern 42j and the capacitor electrode patterns 31i and 33i face each other through the dielectric layer 11i, and configure the coupling capacitor C5. The coupling electrode pattern 42j is a floating electrode that is not connected to any of the external terminals.

The inductor L2 and the balanced-side inductor L3 are disposed adjacent to each other in the lamination direction so as to be electromagnetic-field-coupled to each other. In addition, between the inductor electrode pattern 22d configuring the inductor L2 and the inductor electrode pattern 23e configuring the balanced-side inductor L3, no electrode pattern exists. In the present preferred embodiment, the aperture of the inductor electrode pattern 22d and the aperture of the inductor electrode pattern 23e are arranged so that at least portions thereof overlap with each other when being viewed from the lamination direction. Accordingly, electromagnetic field coupling occurs between the inductor L2 and the balanced-side inductor L3.

In addition, when being viewed from the lamination direction, the central axes of the inductor L2 and the balanced-side inductor L3 coincide with each other. In addition, when being viewed from the lamination direction, portions of the electrode patterns of the inductor L2 and the balanced-side inductor L3 overlap with each other.

As described above, the unbalanced-side LC parallel resonator LC1, the intermediate LC parallel resonator LC2, the balanced-side inductor L3, the inductors L4 and L5, the capacitors C3 and C4, and the coupling capacitor C5 are provided within the laminated body.

Arrows in FIG. 3 indicate the directions of current flowing to the ground terminal 3. The inductor electrode patterns 21b, 21c, 22d, and 23e are connected to the ground terminal 3, in the lower right portions of the dielectric layers 11b, 11c, 11d, and 11e on which the inductor electrode patterns 21b, 21c, 22d, and 23e are provided, respectively. Accordingly, when being viewed from the lamination direction from the dielectric layer 11a toward the dielectric layer 11g, the inductor electrode patterns 21b and 21c configuring the inductor L1 circle in a clockwise fashion with respect to the ground terminal 3. In the same way, the inductor electrode pattern 22d configuring the inductor L2 circles in a counterclockwise fashion. Accordingly, it is understood that the circling directions of the inductor electrode patterns 21b and 21c and the circling direction of the inductor electrode pattern 22d are opposite to each other when being viewed from the lamination direction. Therefore, with respect to the ground terminal 3, directions in which the currents of the inductor L1 and the inductor L2 flow are opposite to each other. At this time, since mainly capacitive electromagnetic field coupling between the unbalanced-side LC parallel resonator LC1 and the intermediate LC parallel resonator LC2 is further strengthened, it is not necessary to separately provide a coupling capacitor, and an advantage that a laminated balanced filter is miniaturized is obtained.

Figure 4:
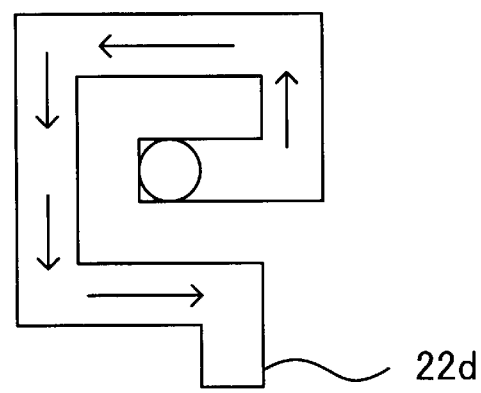
FIG. 4 is an enlarged view illustrating an inductor electrode pattern in FIG. 3.
Figure 4:
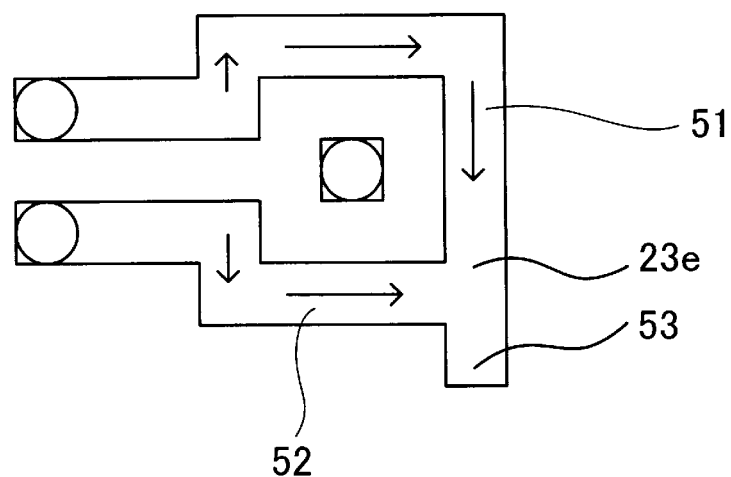

FIG. 4 is an enlarged view illustrating the inductor electrode pattern 22d of the intermediate LC parallel resonator LC2 and the inductor electrode pattern 23e of the balanced-side inductor L3 in FIG. 3. In addition, arrows in the drawing indicate the directions of currents flowing to the ground terminal 3.

A connection portion 53 located in the middle of the inductor electrode pattern 23e of the balanced-side inductor L3 is connected to the ground terminal 3. In addition, the inductor electrode pattern 23e includes a first portion 51 leading from one end portion thereof connected to the via electrode 62 to the connection portion 53 and a second portion 52 leading from the other end portion thereof connected to the via electrode 64 to the connection portion 53.

The direction of a current flowing through the first portion 51 of the inductor electrode pattern 23e is opposite to the direction of a current flowing through the inductor electrode pattern 22d of the intermediate LC parallel resonator LC2. In addition, the direction of a current flowing through the second portion 52 of the inductor electrode pattern 23e is the same as the direction of a current flowing through the inductor electrode pattern 22d of the intermediate LC parallel resonator LC2.

In the present preferred embodiment, the inductor electrode pattern 22d and the inductor electrode pattern 23e are preferably arranged at positions roughly overlapping with each other when being viewed from the lamination direction. In addition, even if the inductor electrode pattern 22d and the inductor electrode pattern 23e are arranged at positions deviated from each other when being viewed from the lamination direction, when the central axes of the pivots of the inductor electrode patterns roughly coincide with each other and a point exists where the directions of currents in corresponding portions are the same as or opposite to each other, the advantageous effects of a preferred embodiment of the present invention are obtained.

In the present preferred embodiment, the coupling capacitor C5 preferably is connected between the balanced terminal T2 connected to the first portion 51 side and the unbalanced terminal T1. In this case, a phase characteristic is about 180° and becomes good, compared with a case where the coupling capacitor C5 is connected between the balanced terminal T3 connected to the second portion 52 side and the unbalanced terminal T1.

In the present preferred embodiment, the inductor electrode patterns 21b, 21c, 22d, 24d, 23e, and 25f are preferably located on one main surface side in the lamination direction of the laminated body. On the other hand, the capacitor electrode patterns 32g, 31i, 33i, 34i, and 42j are formed on the other main surface side in the lamination direction of the laminated body. In this way, by separately disposing the inductor electrode patterns and the capacitor electrode patterns on one main surface side and the other main surface side, respectively, it is possible to further downsize the laminated balanced filter.

In addition, in the present preferred embodiment, the capacitor electrode pattern 32g configuring the intermediate LC parallel resonator LC2 faces to 31i configuring the unbalanced-side LC parallel resonator LC1, 33i and 34i configuring the balanced-side LC parallel resonator, and the coupling electrode pattern 42j configuring the coupling capacitor C5, with the ground electrode pattern 41h disposed therebetween. In this case, it is possible to prevent unnecessary capacitance between the capacitor electrode pattern 32g of the intermediate LC parallel resonator LC2 and the capacitor electrode pattern 33i and 34i of the balanced-side LC parallel resonator from occurring, and also to prevent unnecessary capacitance between the capacitor electrode pattern 32g of the intermediate LC parallel resonator LC2 and the coupling electrode pattern 42j of the coupling capacitor C5 from occurring.

In addition, in the present preferred embodiment, a case has been described where the number of intermediate LC parallel resonators preferably is one, for example. The number of intermediate LC parallel resonators may be more than one. In that case, among the plural intermediate LC parallel resonators, an intermediate LC parallel resonator disposed nearest to the unbalanced-side LC parallel resonator on an equivalent circuit and the unbalanced-side LC parallel resonator are electromagnetic-field-coupled to each other. In addition, the plural intermediate LC parallel resonators are electromagnetic-field-coupled to each other. In addition, among the plural intermediate LC parallel resonators, an intermediate LC parallel resonator disposed nearest to the balanced-side inductor on the equivalent circuit and the balanced-side inductor are electromagnetic-field-coupled to each other.

So as to confirm the advantageous effects of a preferred embodiment of the present invention, the simulation results of laminated balanced filters of an experimental example, a first comparative example, and a second comparative example were compared with one another.

First, it was assumed that the laminated balanced filter described in FIG. 1 to FIG. 4 was the experimental example.

Figure 5A:
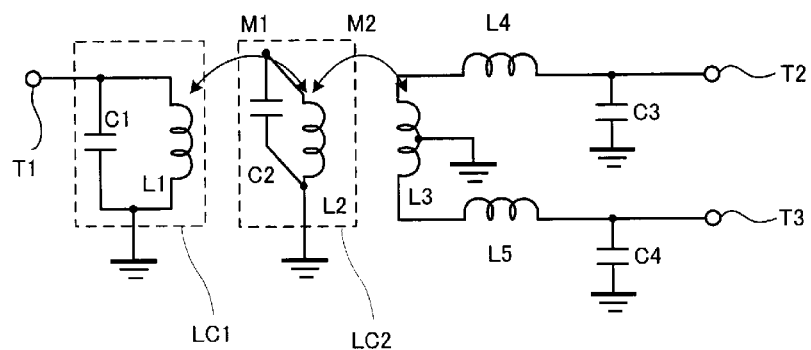
FIGS. 5A and 5B are equivalent circuit diagrams of laminated balanced filters of comparative examples.
Figure 5B:
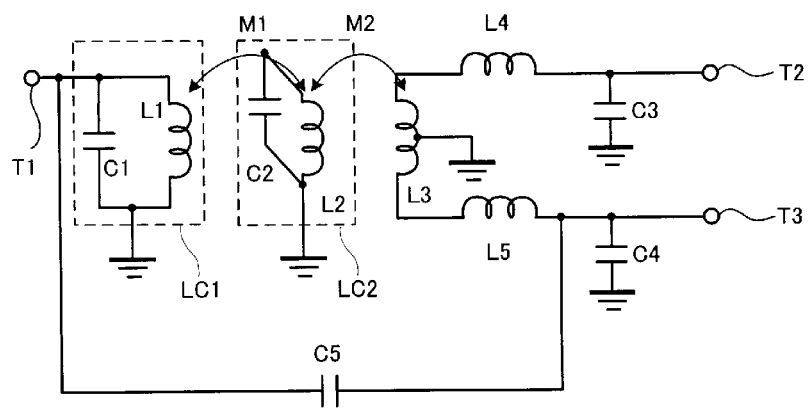

FIGS. 5A and 5B are the equivalent circuit diagrams of laminated balanced filters of the comparative examples. It was assumed that a laminated balanced filter having no coupling capacitor as illustrated in FIG. 5A (refer to the C5 in FIG. 1) was the first comparative example. In addition, it was assumed that a laminated balanced filter where the coupling capacitor C5 was connected to the second portion side as illustrated in FIG. 5B (refer to FIG. 3) was the second comparative example. In other words, in the second comparative example, the coupling electrode pattern 42j and the capacitor electrode patterns 31i and 34i face each other through the dielectric layer 11i, and configure the coupling capacitor C5. In addition, with respect to the laminated balanced filters of the experimental example, the first comparative example, and the second comparative example, the transmission characteristics thereof and the phase characteristics thereof were compared in simulations.

Figure 6A:
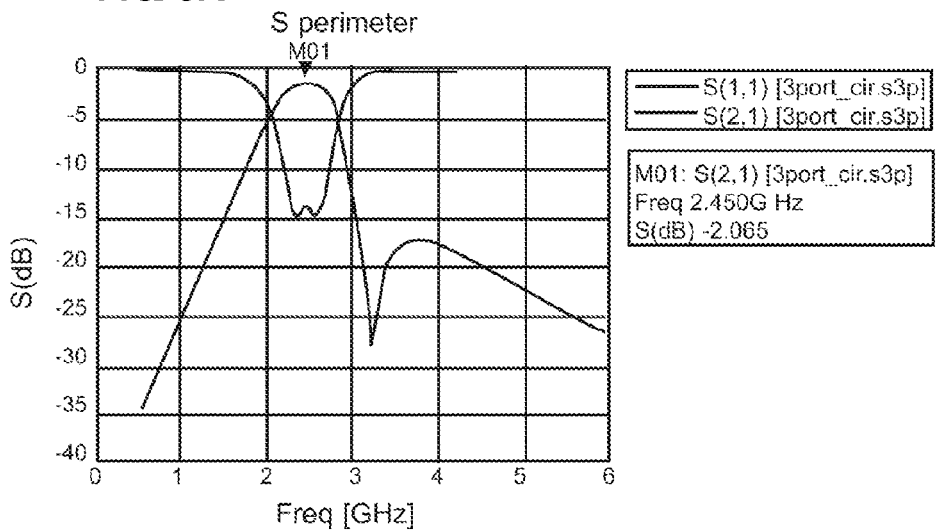
FIGS. 6A, 6B, and 6C are graphs illustrating transmission characteristics of an experimental example, a first comparative example, and a second comparative example.
Figure 6B:
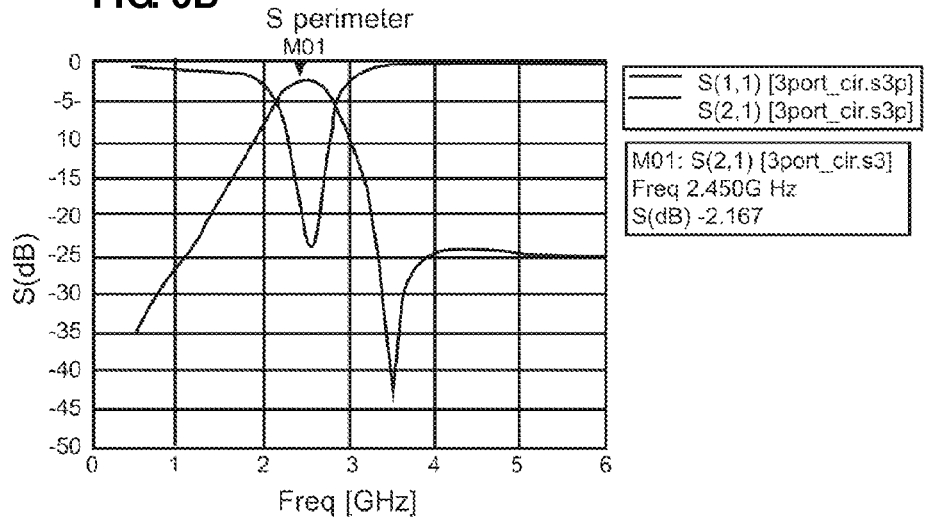
Figure 6C:
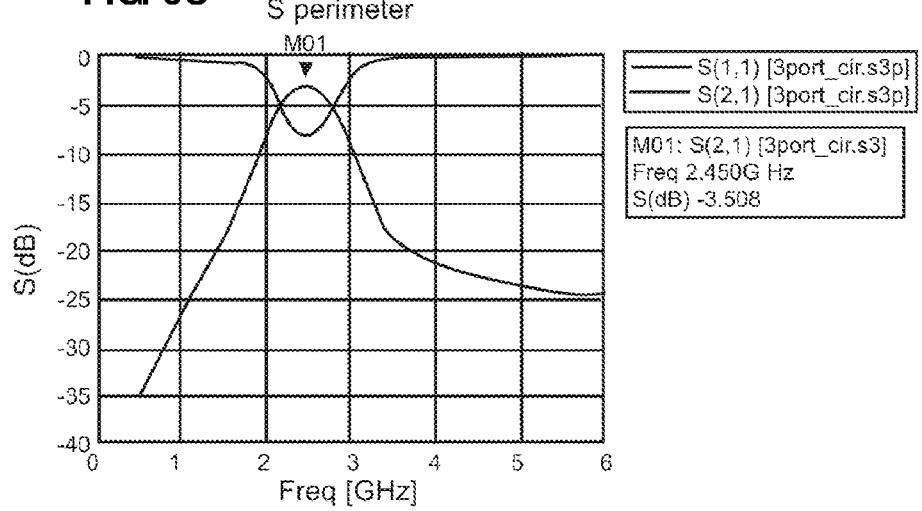

FIGS. 6A, 6B, and 6C illustrate the simulation results of the transmission characteristics. FIG. 6A is the result of the experimental example, FIG. 6B is the result of the first comparative example, and FIG. 6C is the result of the second comparative example. It is understood that, compared with the first comparative example, in the experimental example, it is possible to design an attenuation pole in the vicinity of about 3.2 GHz desired, by providing the coupling capacitor. In addition, in the second comparative example where the coupling filter C5 is connected to the second portion side, an attenuation pole supposed to exist on the high frequency side of a pass band disappears, and a filter characteristic is degraded.

Figure 7A:
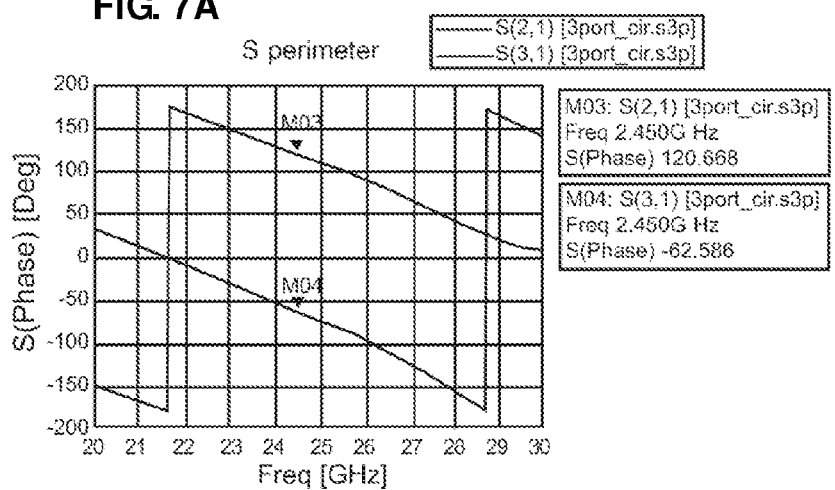
FIGS. 7A, 7B, and 7C are graphs illustrating phase characteristics of the experimental example, the first comparative example, and the second comparative example.
Figure 7B:
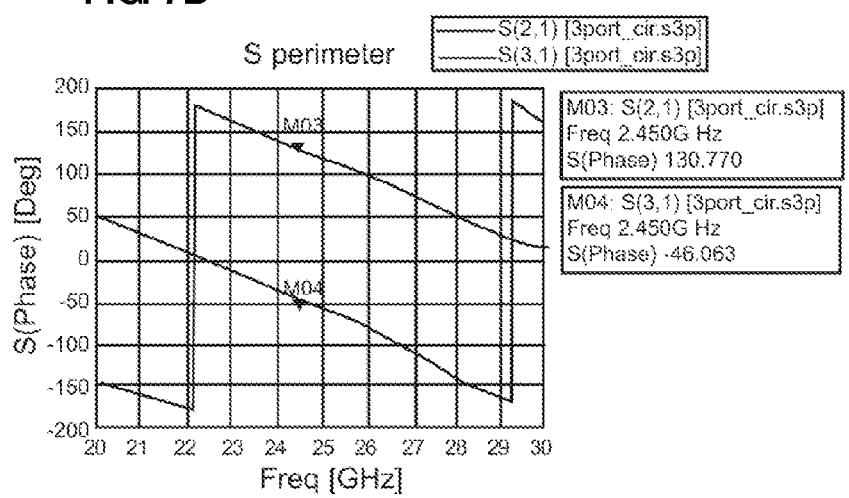
Figure 7C:
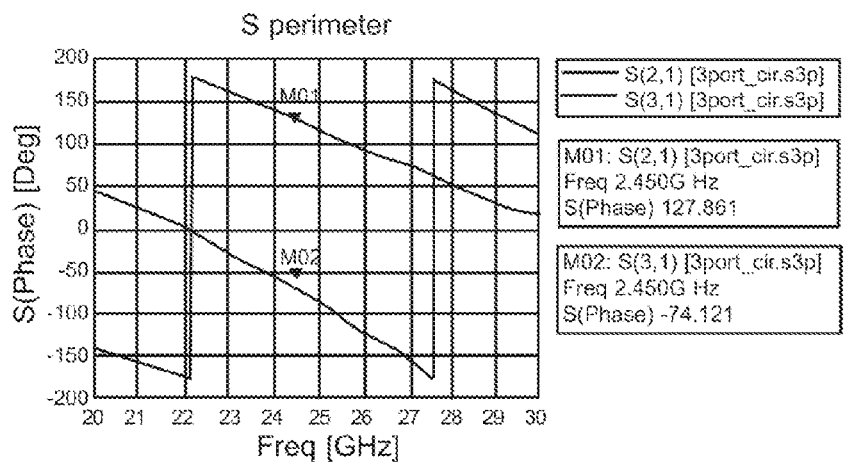
Figure 8:
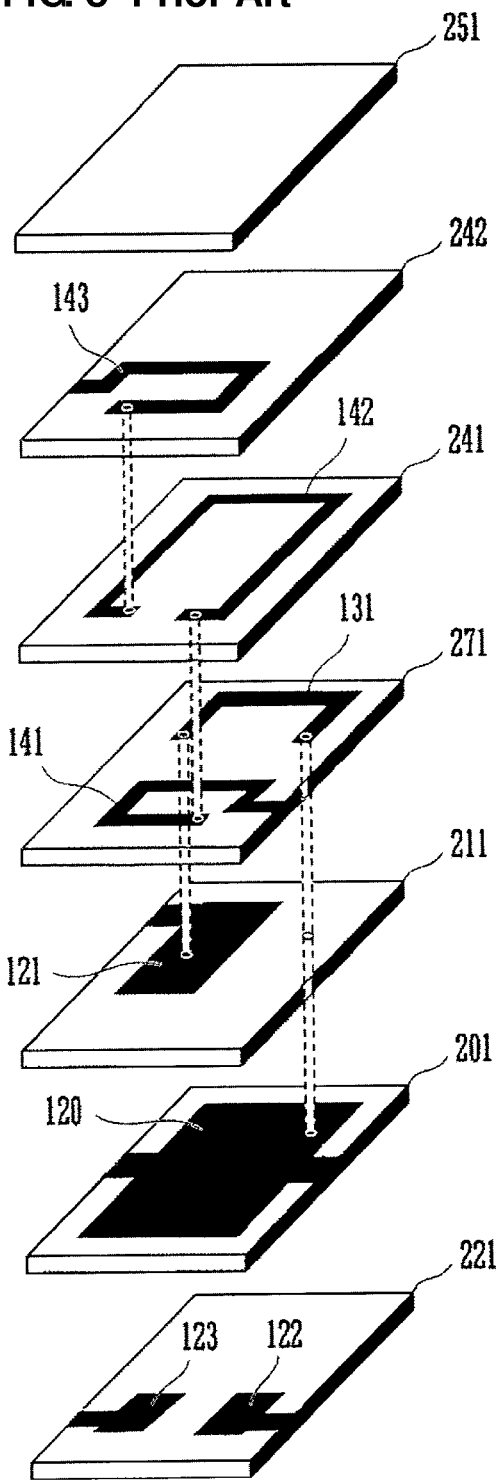
FIG. 8 is an exploded perspective view illustrating a laminated balanced filter of the related art.
Figure 9:
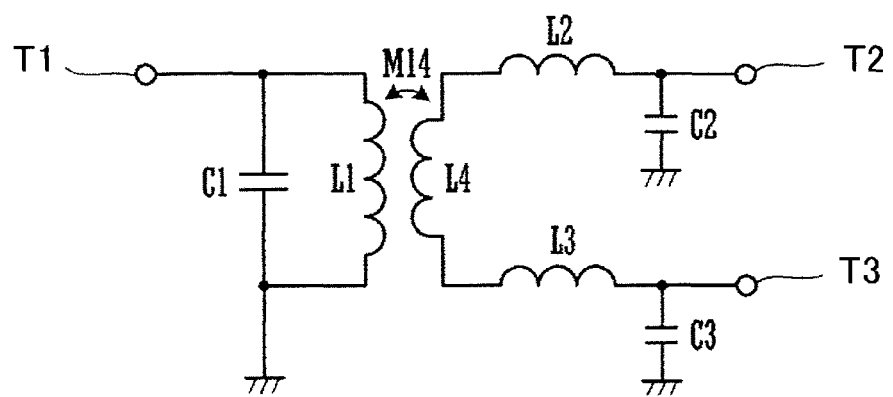
FIG. 9 is an equivalent circuit diagram of the laminated balanced filter of the related art.

FIGS. 7A, 7B, and 7C illustrate the simulation results of the phase characteristics. FIG. 7A is the result of the experimental example, FIG. 7B is the result of the first comparative example, and FIG. 7C is the result of the second comparative example. The phase differences of the balanced signals of the experimental example, the first comparative example, and the second comparative example were 177 degrees, 183 degrees, and 202 degrees, respectively. For this reason, the experimental example where the coupling capacitor is connected to the first portion side has a phase characteristic comparable with the first comparative example having no coupling capacitor. On the other hand, in the second comparative example where the coupling capacitor is connected to the second portion side, it has become clear that a phase characteristic is degraded.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated balanced filter comprising:
a laminated body including a plurality of dielectric layers and a plurality of electrode patterns located on the plurality of dielectric layers;
one unbalanced terminal;
two balanced terminals;
a ground terminal;
an unbalanced-side LC parallel resonator including one end portion connected to the ground terminal and another end portion connected to the one unbalanced terminal;
a balanced-side inductor including two end portions that are individually connected to the two balanced terminals; and
at least one intermediate LC parallel resonator including one end portion connected to the ground terminal and disposed between the unbalanced-side LC parallel resonator and the balanced-side inductor and the at least one intermediate LC parallel resonator is electromagnetic-field-coupled to the unbalanced-side LC parallel resonator and the balanced-side inductor;
the one unbalanced terminal, the two balanced terminal, and the ground terminal are provided on the laminated body;
the balanced-side inductor includes an inductor electrode pattern on a predetermined dielectric layer of the laminated body, wherein a connection portion in a central portion or approximately the central portion of the inductor electrode pattern is connected to the ground terminal and the inductor electrode pattern includes a first portion extending from one end portion thereof to the connection portion and a second portion extending from the other end portion thereof to the connection portion;
the at least one intermediate LC parallel resonator includes an inductor electrode pattern on a layer of the laminated body and that is different from the inductor electrode pattern of the balanced-side inductor;
a direction of a current flowing through the first portion of the inductor electrode pattern of the balanced-side inductor is opposite to a direction of a current flowing through the inductor electrode pattern of the at least one intermediate LC parallel resonator and a direction of a current flowing through the second portion of the inductor electrode pattern of the balanced-side inductor is the same as the direction of the current flowing through the inductor electrode pattern of the at least one intermediate LC parallel resonator;
the laminated balanced filter further includes a coupling capacitor connected between the balanced terminal connected to the first portion side and the one unbalanced terminal; and
the balanced-side inductor and the inductor electrode pattern of the at least one intermediate LC parallel resonator have substantially helical shapes.

2. The laminated balanced filter according to claim 1, wherein at least portions of an aperture of the inductor electrode pattern of the at least one intermediate LC parallel resonator and an aperture of the inductor electrode pattern of the balanced-side inductor overlap with each other when being viewed from a lamination direction.

3. The laminated balanced filter according to claim 2, wherein positions of central axes of the aperture of the inductor electrode pattern of the at least one intermediate LC parallel resonator and the aperture of the inductor electrode pattern of the balanced-side inductor coincide with each other when being viewed from the lamination direction.

4. The laminated balanced filter according to claim 3, wherein the unbalanced-side LC parallel resonator includes a substantially helical-shaped inductor electrode pattern, and a circling direction of the inductor electrode pattern of the unbalanced-side LC parallel resonator and a circling direction of the inductor electrode pattern of the at least one intermediate LC parallel resonator are opposite to each other when being viewed from the lamination direction.

5. The laminated balanced filter according to claim 4, wherein each inductor electrode pattern and a capacitor electrode pattern of the laminated balanced filter are separately disposed on one main surface side and another main surface side in the lamination direction of the laminated body.

6. The laminated balanced filter according to claim 3, wherein each inductor electrode pattern and a capacitor electrode pattern of the laminated balanced filter are separately disposed on one main surface side and another main surface side in the lamination direction of the laminated body.

7. The laminated balanced filter according to claim 2, wherein the unbalanced-side LC parallel resonator includes a substantially helical-shaped inductor electrode pattern, and a circling direction of the inductor electrode pattern of the unbalanced-side LC parallel resonator and a circling direction of the inductor electrode pattern of the at least one intermediate LC parallel resonator are opposite to each other when being viewed from the lamination direction.

8. The laminated balanced filter according to claim 7, wherein each inductor electrode pattern and a capacitor electrode pattern of the laminated balanced filter are separately disposed on one main surface side and another main surface side in the lamination direction of the laminated body.

9. The laminated balanced filter according to claim 2, wherein each inductor electrode pattern and a capacitor electrode pattern of the laminated balanced filter are separately disposed on one main surface side and another main surface side in the lamination direction of the laminated body.

10. The laminated balanced filter according to claim 1, wherein each inductor electrode pattern and a capacitor electrode pattern of the laminated balanced filter are separately disposed on one main surface side and another main surface side in a lamination direction of the laminated body.

11. The laminated balanced filter according to claim 1, wherein positions of central axes of an aperture of the inductor electrode pattern of the at least one intermediate LC parallel resonator and an aperture of the inductor electrode pattern of the balanced-side inductor coincide with each other when being viewed from a lamination direction.

12. The laminated balanced filter according to claim 11, wherein the unbalanced-side LC parallel resonator includes a substantially helical-shaped inductor electrode pattern, and a circling direction of the inductor electrode pattern of the unbalanced-side LC parallel resonator and a circling direction of the inductor electrode pattern of the at least one intermediate LC parallel resonator are opposite to each other when being viewed from the lamination direction.

13. The laminated balanced filter according to claim 12, wherein each inductor electrode pattern and a capacitor electrode pattern of the laminated balanced filter are separately disposed on one main surface side and another main surface side in the lamination direction of the laminated body.

14. The laminated balanced filter according to claim 11, wherein each inductor electrode pattern and a capacitor electrode pattern of the laminated balanced filter are separately disposed on one main surface side and another main surface side in the lamination direction of the laminated body.

15. The laminated balanced filter according to claim 1, wherein the unbalanced-side LC parallel resonator includes a substantially helical-shaped inductor electrode pattern, and a circling direction of the inductor electrode pattern of the unbalanced-side LC parallel resonator and a circling direction of the inductor electrode pattern of the at least one intermediate LC parallel resonator are opposite to each other when being viewed from a lamination direction.

16. The laminated balanced filter according to claim 15, wherein each inductor electrode pattern and a capacitor electrode pattern of the laminated balanced filter are separately disposed on one main surface side and another main surface side in the lamination direction of the laminated body.

17. The laminated balanced filter according to claim 1, wherein an inductor electrode pattern and a capacitor electrode pattern of the unbalanced-side LC parallel resonator are separately disposed on one main surface side and another main surface side in a lamination direction of the laminated body and the inductor electrode pattern of the at least one intermediate LC parallel resonator and the inductor electrode pattern of the balanced-side inductor are disposed therebetween.

\* \* \* \* \*